(12) United States Patent
Nomura

(10) Patent No.: US 9,099,536 B2
(45) Date of Patent: Aug. 4, 2015

(54) SEMICONDUCTOR DEVICE AND METHOD OF PRODUCING SEMICONDUCTOR DEVICE

(71) Applicant: LAPIS Semiconductor Co., Ltd., Yokohama-shi, Kanagawa (JP)

(72) Inventor: Akihiko Nomura, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 83 days.

(21) Appl. No.: 13/896,561

(22) Filed: May 17, 2013

(65) Prior Publication Data

US 2013/0313688 A1  Nov. 28, 2013

(30) Foreign Application Priority Data

May 25, 2012  (JP) ................. 2012-120284

(51) Int. Cl.
*H01L 21/768* (2006.01)
*H01L 23/48* (2006.01)

(52) U.S. Cl.
CPC .... *H01L 21/76877* (2013.01); *H01L 21/76898* (2013.01); *H01L 23/481* (2013.01); *H01L 2924/0002* (2013.01)

(58) Field of Classification Search
CPC ..... H01L 21/768; H01L 23/48; H01L 21/476; H01L 21/4763

USPC ......... 438/624, 622, 637, 629, 638, 639, 667, 438/675, 652
See application file for complete search history.

(56) References Cited

U.S. PATENT DOCUMENTS

2008/0050911 A1* 2/2008 Borthakur ..................... 438/622
2011/0006303 A1* 1/2011 Muta .............................. 257/48

FOREIGN PATENT DOCUMENTS

| JP | 2005-294320 A | 10/2005 |
| JP | 2008-053430 A | 3/2008 |
| JP | 2010-114201 A | 5/2010 |

* cited by examiner

*Primary Examiner* — Chuong A Luu
(74) *Attorney, Agent, or Firm* — Kubotera & Associates LLC

(57) ABSTRACT

A method of producing a semiconductor device includes the step of forming a through hole in a semiconductor substrate. The semiconductor substrate has a first main surface and a second main surface opposite to the first main surface, and includes a first conductive layer formed on the second main surface. The through hole penetrates through the semiconductor substrate from the first main surface to the second main surface, so that the first conductive layer formed on the second main surface is exposed at a bottom portion of the through hole. The method further includes the steps of forming a seed layer on a side surface of the through hole from the bottom portion of the through hole to the first main surface; forming a second conductive layer on the seed layer through a first plating process; and forming a third conductive layer selectively on the second conductive layer.

8 Claims, 20 Drawing Sheets

SEMICONDUCTOR DEVICE AND METHOD OF PRODUCING SEMICONDUCTOR DEVICE

BACKGROUND OF THE INVENTION AND RELATED ART STATEMENT

The present invention relates to a semiconductor device and a method of producing the semiconductor device. More specifically, the present invention relates to a semiconductor device including a silicon through electrode (TSV: Through Silicon Via), and a method of producing the semiconductor device.

A conventional semiconductor device and a conventional method of producing the conventional semiconductor device have been proposed, in which a through hole is formed in a semiconductor substrate such as a silicon substrate and the like, and an electrode, i.e., a silicon through electrode (TSV: Through Silicon Via), is formed in the through hole (refer to Patent References No. 1 to No. 3).

Patent Reference No. 1: Japanese Patent Publication No. 2005-294320

Patent Reference No. 2: Japanese Patent Publication No. 2010-114201

Patent Reference No. 3: Japanese Patent Publication No. 2008-53430

In the conventional semiconductor device having the silicon through electrode, or the conventional method of producing the conventional semiconductor device, a seed layer for plating is formed in the through hole formed in the silicon substrate. However, a defect such as a pin hole and the like tends to be formed in the seed layer. When such a defect is formed in the seed layer, an electrode layer formed on a surface of the silicon substrate becomes susceptible to erosion due to the defect, thereby deteriorating reliability of the conventional semiconductor device.

In view of the problems described above, an object of the present invention is to provide a semiconductor device having a through electrode formed in a substrate and a method of producing the semiconductor device capable of solving the problems of the conventional method. In the present invention, it is possible to produce the semiconductor device with high reliability.

Further objects and advantages of the invention will be apparent from the following description of the invention.

SUMMARY OF THE INVENTION

In order to attain the objects described above, according to a first aspect of the present invention, a method of producing a semiconductor device includes the step of forming a through hole in a semiconductor substrate. The semiconductor substrate has a first main surface and a second main surface opposite to the first main surface. The semiconductor substrate includes a first conductive layer formed on the second main surface. The through hole is formed so that the through hole penetrates through the semiconductor substrate from the first main surface to the second main surface, so that the first conductive layer formed on the second main surface is exposed at a bottom portion of the through hole.

According to the first aspect of the present invention, the method of producing the semiconductor device further includes the steps of forming a seed layer on a side surface of the through hole from the bottom portion of the through hole to the first main surface; forming a second conductive layer on the seed layer through a first plating process; and forming a third conductive layer selectively on the second conductive layer.

According to a second aspect of the present invention, a semiconductor device includes a semiconductor substrate having a through hole formed therein. The semiconductor substrate has a first main surface and a second main surface opposite to the first main surface. The semiconductor substrate includes a first conductive layer formed on the second main surface. The through hole is formed so that the through hole penetrates through the semiconductor substrate from the first main surface to the second main surface, so that the first conductive layer formed on the second main surface is exposed at a bottom portion of the through hole.

According to the second aspect of the present invention, the semiconductor device further includes a seed layer formed on a side surface of the through hole from the bottom portion of the through hole to the first main surface; a first conductive plated layer formed on the seed layer; a second conductive plated layer formed on the first conductive plated layer; and a semiconductor element disposed on the second main surface of the semiconductor substrate.

According to a third aspect of the present invention, a method of producing a semiconductor device includes the step of forming a through hole in a semiconductor substrate. The semiconductor substrate has a first main surface and a second main surface opposite to the first main surface. The semiconductor substrate includes a first conductive layer formed on the second main surface and a second conductive layer formed on the first conductive layer. The through hole is formed so that the through hole penetrates through the semiconductor substrate from the first main surface to the second main surface, so that among the first conductive layer formed on the second main surface and the second conductive layer formed on the first conductive layer, the first conductive layer closer to the second main surface is exposed at a bottom portion of the through hole.

According to the third aspect of the present invention, the method of producing the semiconductor device further includes the steps of forming a seed layer on a side surface of the through hole from the bottom portion of the through hole to the first main surface; forming a resist layer on the seed layer; forming an opening portion in the resist layer through a developing process so that the through hole is exposed; and forming a third conductive layer on the seed layer exposed from the resist layer through a first plating process with the resist layer having the opening portion arranged as a mask.

As described above, in the present invention, it is possible to provide the semiconductor device with high reliability having the through electrode formed in the substrate and the method of producing the semiconductor device.

DETAILED DESCRIPTION OF PREFERRED EMBODIMENTS

Hereunder, preferred embodiments of the present invention will be explained with reference to the accompanying drawings.

First Embodiment

Figure 5:
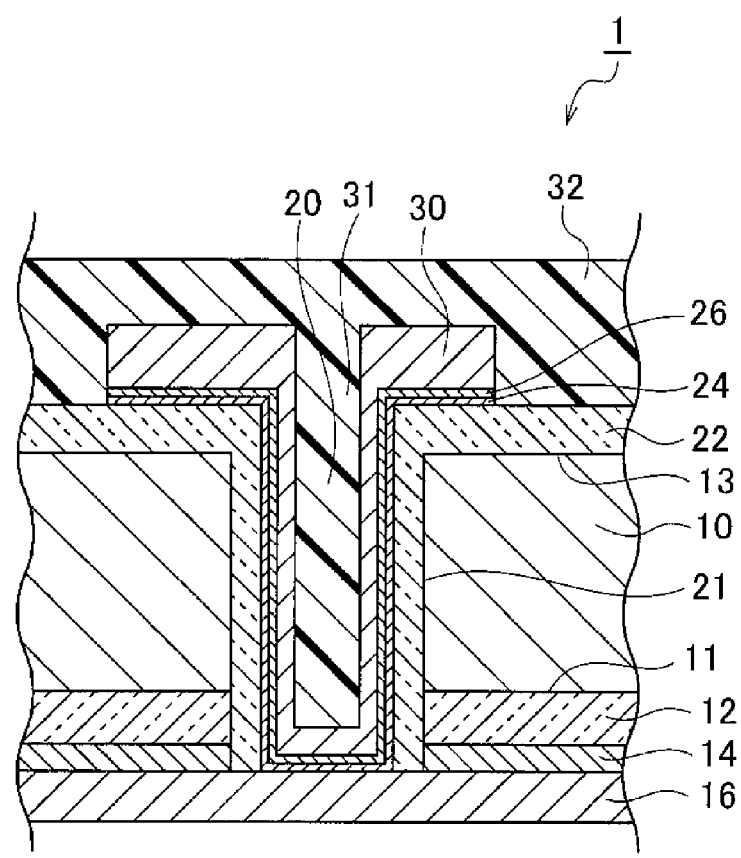
FIG. 5 is a schematic sectional view showing the semiconductor device according to the first embodiment of the present invention.

A first embodiment of the present invention will be explained. FIG. 5 is a schematic sectional view showing a semiconductor device 1 according to the first embodiment of the present invention.

As shown in FIG. 5, the semiconductor device 1 includes a semiconductor silicon substrate 10; a silicon oxide layer 12; a titanium nitride (TiN) layer 14; an aluminum (Al) layer 16; a through hole 20; a CVD (Chemical Vapor Deposition) oxide layer 22; a seed metal layer 24; a copper (Cu) plated layer 26; a copper (Cu) plated layer 30; and a solder resist 32.

In the first embodiment, the silicon oxide layer 12 is disposed on a main surface 11 of the semiconductor silicon substrate 10. The titanium nitride (TiN) layer 14 is disposed on the silicon oxide layer 12. The aluminum (Al) layer 16 is disposed on the TiN layer 14. The through hole 20 is formed to penetrate through the semiconductor silicon substrate 10 from the main surface 11 thereof to a main surface 13 thereof opposite to the main surface 11. Further, the through hole 20 is formed to penetrate through the silicon oxide layer 12 and the TiN layer 14, so that the Al layer 16 is exposed.

In the first embodiment, the CVD oxide layer 22 is disposed on a side surface 21 of the through hole 20 and the main surface 13 of the semiconductor silicon substrate 10. The seed metal layer 24 is disposed on the CVD oxide layer 22 in the through hole 20 and the CVD oxide layer 22 on the main surface 13 as well as on the Al layer 16 exposed at a bottom portion of the through hole 20. The Cu plated layer 26 is disposed on the seed metal layer 24 in the through hole 20 and the seed metal layer 24 on the main surface 13 as well as on the seed metal layer 24 disposed at the bottom portion of the through hole 20.

In the first embodiment, the Cu plated layer 30 is disposed on the Cu plated layer 26 in the through hole 20 and the Cu plated layer 26 on the main surface 13 as well as on the Cu plated layer 26 disposed at the bottom portion of the through hole 20. The solder resist 32 is disposed on the CVD oxide layer 22 on the main surface 13 of the semiconductor silicon substrate 10 and the Cu plated layer 30 on the main surface 13 as well as in an opening portion 31 of the Cu plated layer 30 in the through hole 20. It should be noted that a circuitry element (not shown) such as a semiconductor element including a MOS transistor is formed on the main surface 11 of the semiconductor silicon substrate 10, and is covered with the silicon oxide layer 12. The aluminum layer 16 is arranged to function as a device pad and the like for connecting the semiconductor device 1.

Figure 1A:
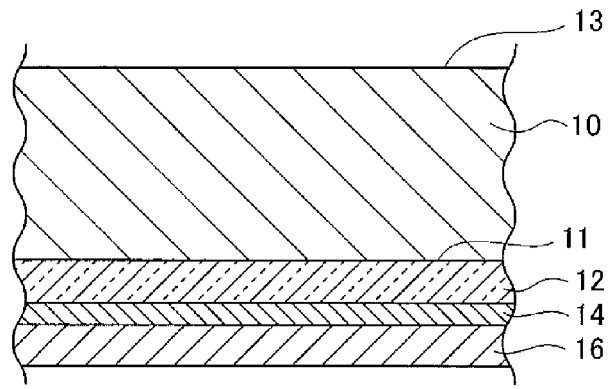
FIGS. 1(A) to 1(C) are schematic sectional views No. 1 showing a method of producing a semiconductor device according to a first embodiment of the present invention.
Figure 1B:
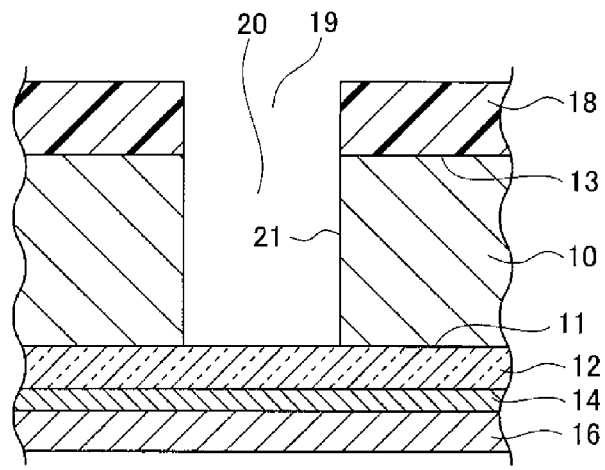
Figure 1C:
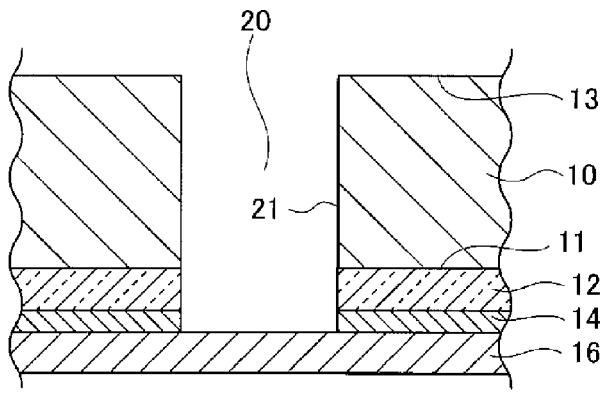
Figure 2A:
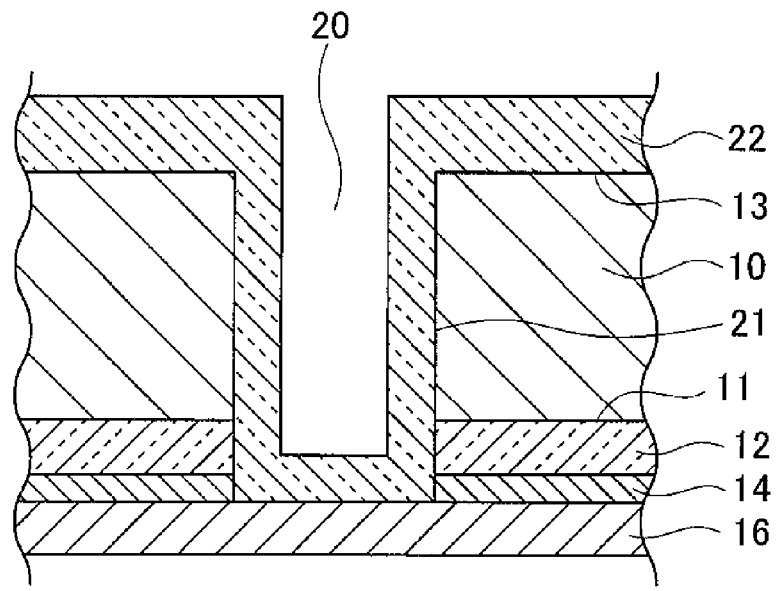
FIGS. 2(A) and 2(B) are schematic sectional views No. 2 showing the method of producing the semiconductor device according to the first embodiment of the present invention.
Figure 2B:
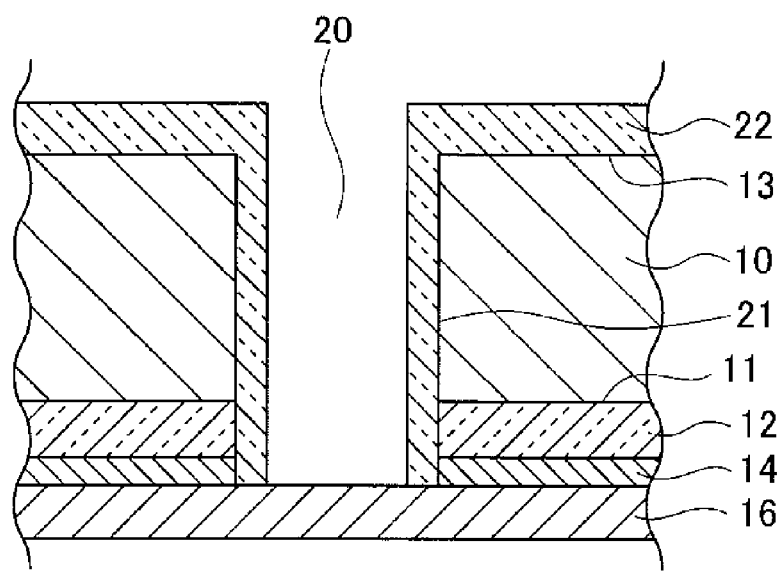

A method of producing the semiconductor device 1 will be explained next with reference to FIGS. 1(A)-1(C) to FIG. 9. FIGS. 1(A) to 1(C) are schematic sectional views No. 1 showing a method of producing the semiconductor device 1 according to the first embodiment of the present invention. FIGS. 2(A) and 2(B) are schematic sectional views No. 2 showing the method of producing the semiconductor device 1 according to the first embodiment of the present invention.

Figure 3A:
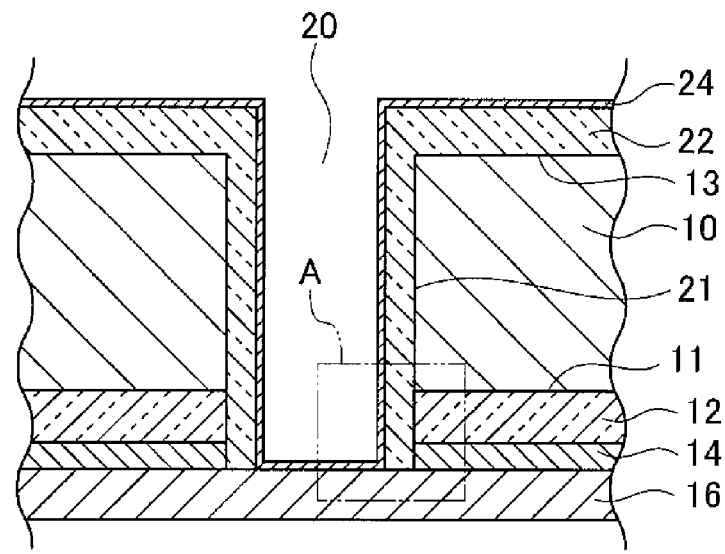
FIGS. 3(A) and 3(B) are schematic sectional views No. 3 showing the method of producing the semiconductor device according to the first embodiment of the present invention.
Figure 3B:
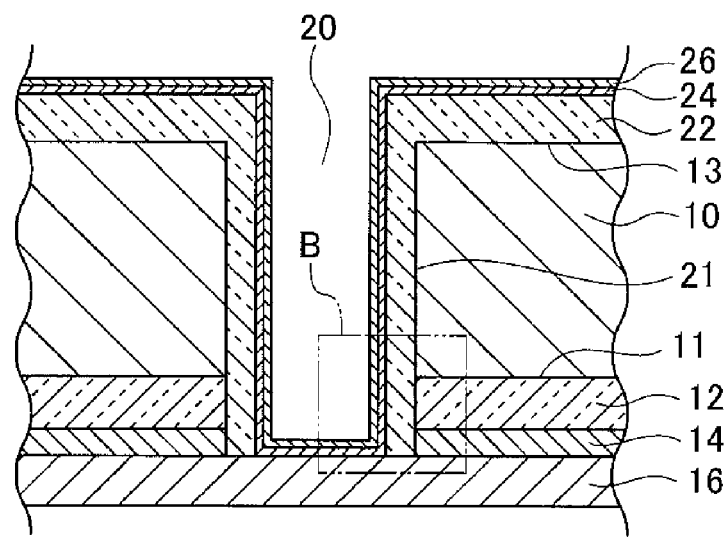
Figure 4A:
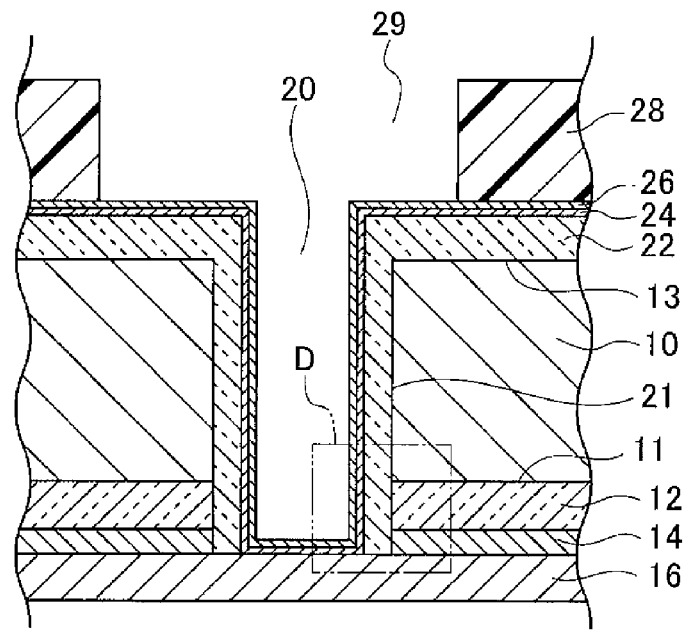
FIGS. 4(A) and 4(B) are schematic sectional views No. 4 showing the method of producing the semiconductor device according to the first embodiment of the present invention.
Figure 4B:
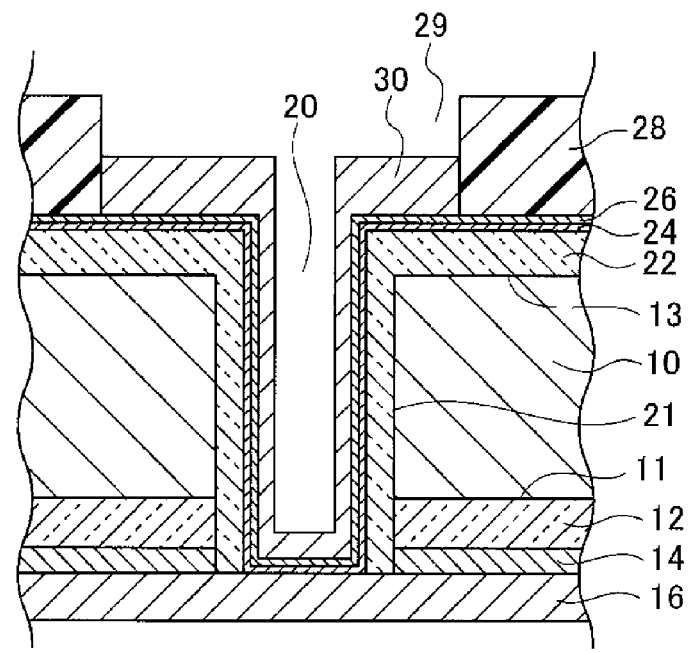

Further, FIGS. 3(A) and 3(B) are schematic sectional views No. 3 showing the method of producing the semiconductor device 1 according to the first embodiment of the present invention. FIGS. 4(A) and 4(B) are schematic sectional views No. 4 showing the method of producing the semiconductor device 1 according to the first embodiment of the present invention.

First, a circuitry element (not shown) such as a semiconductor element including a MOS transistor and the like is formed on the main surface 11 of the semiconductor silicon substrate 10.

As shown in FIG. 1(A), in the next step, the silicon oxide layer 12 is formed on the main surface 11 of the semiconductor silicon substrate 10, and the TiN layer 14 is formed on the silicon oxide layer 12. Further, the Al layer 16 is formed on the TiN layer 14. It should be noted that the TiN layer 14 is provided for preventing migration of aluminum (Al).

As shown in FIG. 1(B), in the next step, a resist 18 is formed on the main surface 13 of the semiconductor silicon substrate 10 opposite to the main surface 11, and an opening portion 19 is selectively formed in the resist 18. Afterward, an etching process is performed on the semiconductor silicon substrate 10 with the resist 18 as a mask, so that the through hole 20 is formed to penetrate through the semiconductor silicon substrate 10 from the main surface 13 to the main surface 11 of the semiconductor silicon substrate 10.

As shown in FIG. 1(C), in the next step, the etching process is further performed on the silicon oxide layer 12 and the TiN layer 14, so that the Al layer 16 is exposed at the bottom portion of the through hole 20.

As shown in FIG. 2(A), in the next step, the CVD oxide layer 22 is formed on a side surface 21 and the bottom portion of the through hole 20 and the main surface 13 of the semiconductor silicon substrate 10.

As shown in FIG. 2(B), in the next step, the etching process is performed on the CVD oxide layer 22, so that the Al layer 16 is exposed at the bottom portion of the through hole 20.

As shown in FIG. 3(A), in the next step, a sputtering process is performed, so that the seed metal layer 24 is formed on the CVD oxide layer 22 in the through hole 20, the CVD oxide layer 22 on the main surface 13, and the Al layer 16 exposed at the bottom portion of the through hole 20. When the seed metal layer 24 is formed, titanium (Ti) is sputtered first, and then copper (Cu) is sputtered afterward.

As shown in FIG. 3(B), in the next step, a whole surface copper plating process is performed, so that the Cu plated layer 26 is formed on the seed metal layer 24 in the through hole 20, the seed metal layer 24 on the main surface 13, and the seed metal layer 24 disposed at the bottom portion of the through hole 20. When the Cu plated layer 26 is formed, a non-electrolytic plating process or an electrolytic plating process using the seed metal layer 24 is performed.

As shown in FIG. 4(A), in the next step, a dry film 28 is formed on the Cu plated layer 26 on the seed metal layer 24, and an opening portion 29 is selectively formed in the dry film 28, so that the through hole 20 and the Cu plated layer 26 around the through hole 20 are exposed in the opening portion 29.

As shown in FIG. 4(B), in the next step, with the dry film 28 as a mask, the Cu plated layer 30 is formed on the Cu plated layer 26 in the through hole 20, the Cu plated layer 26 on the main surface 13 in the opening portion 29 of the dry film 28, and the Cu plated layer 26 disposed at the bottom portion of the through hole 20. When the Cu plated layer 30 is formed, the electrolytic plating process using the seed metal layer 24 and the Cu plated layer 26 is performed.

As shown in FIG. 5, in the next step, the dry film 28 is removed. Afterward, the Cu plated layer 26 and the seed metal layer 24 not covered with the Cu plated layer 30 are removed. Then, the solder resist 32 is formed on the CVD oxide layer 22 on the main surface 13 of the semiconductor silicon substrate 10, the Cu plated layer 30 on the main surface 13, and in an opening portion 31 of the Cu plated layer 30 in the through hole 20.

Figure 6:
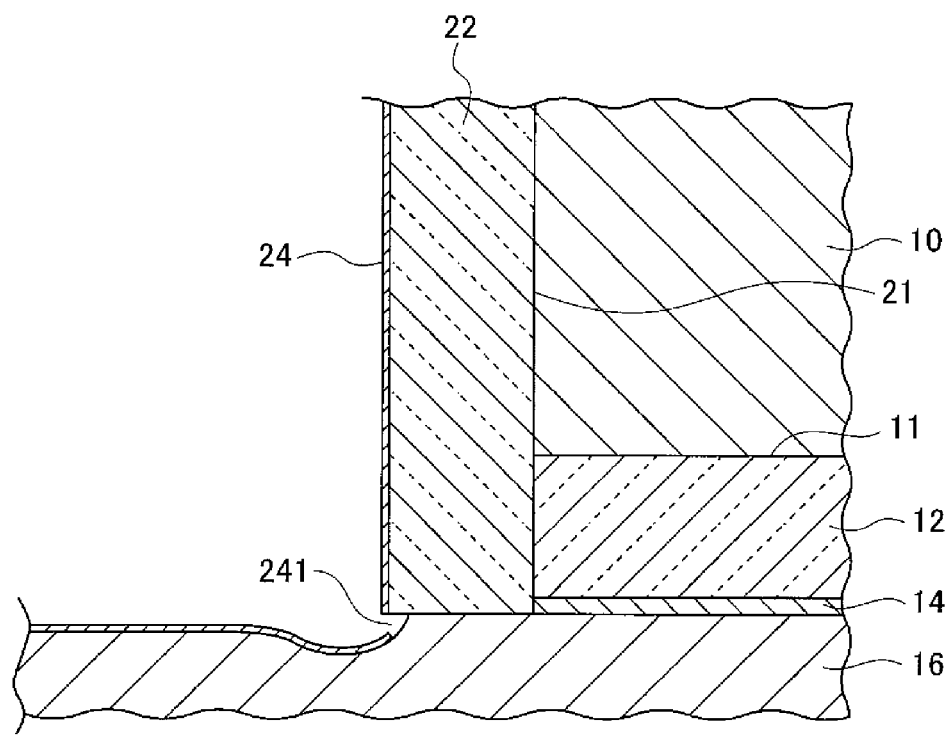
FIG. 6 is a schematic enlarged partial sectional view of an area A in FIG. 3(A) according to the first embodiment of the present invention.
Figure 7:
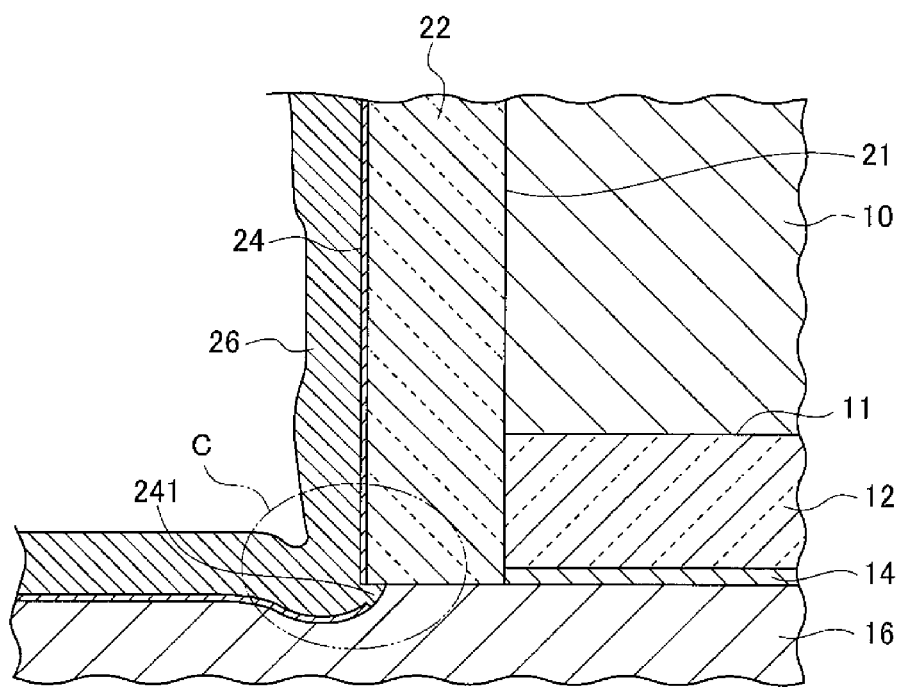
FIG. 7 is a schematic enlarged partial sectional view of an area B in FIG. 3(B) according to the first embodiment of the present invention.
Figure 8:
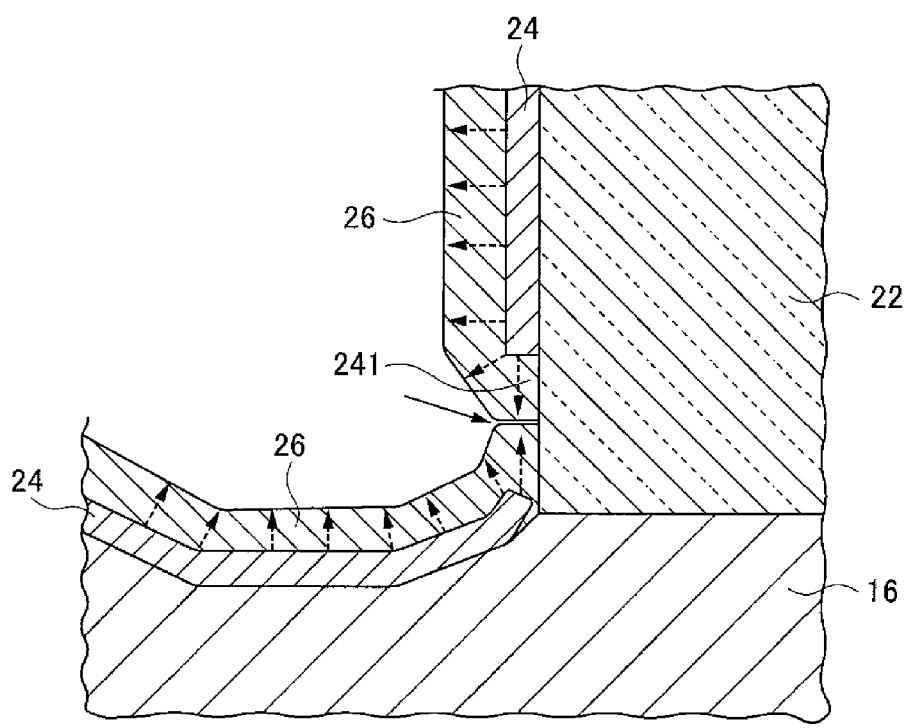
FIG. 8 is a schematic enlarged partial sectional view of an area C in FIG. 7 according to the first embodiment of the present invention.
Figure 9:
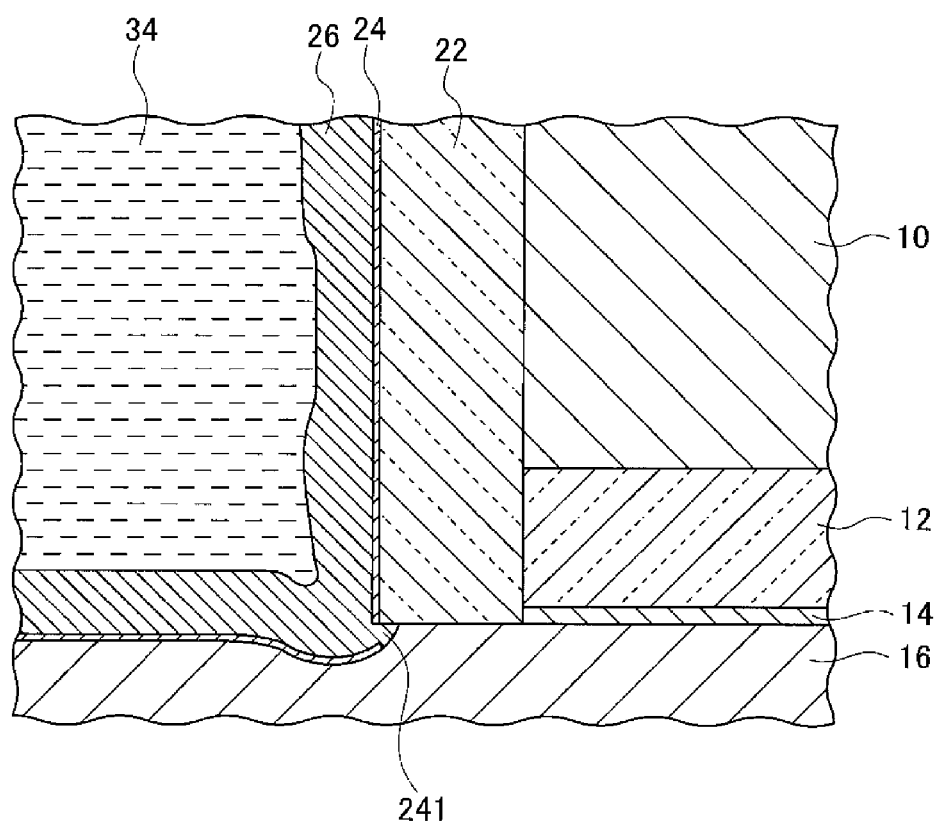
FIG. 9 is a schematic enlarged partial sectional view of an area D in FIG. 4(A) according to the first embodiment of the present invention.

FIG. 6 is a schematic enlarged partial sectional view of an area A in FIG. 3(A) according to the first embodiment of the present invention. FIG. 7 is a schematic enlarged partial sectional view of an area B in FIG. 3(B) according to the first embodiment of the present invention. FIG. 8 is a schematic enlarged partial sectional view of an area C in FIG. 7 according to the first embodiment of the present invention. FIG. 9 is a schematic enlarged partial sectional view of an area D in FIG. 4(A) according to the first embodiment of the present invention;

In general, it is difficult to form the seed metal layer 24 uniformly in the through hole 20 through the sputtering process. As shown in FIG. 6, a non-sputtered portion 241 may be generated at a corner of the bottom portion of the through hole 20.

In the first embodiment, as described above, the whole surface copper plating process is performed, so that the Cu plated layer 26 is formed on the seed metal layer 24 in the through hole 20 and the seed metal layer 24 disposed at the bottom portion of the through hole 20. Accordingly, it is possible to cover the non-sputtered portion 241 with the Cu plated layer 26. It should be noted that the whole surface copper plating process proceeds through an isotropic growth. Accordingly, as shown in FIG. 8, the non-sputtered portion 241 is filled with copper in the whole surface copper plating process.

Further, in the first embodiment, as shown in FIG. 9, when the dry film 28 is formed, a developing solution 34 (for example, sodium carbonate solution) of the dry film 28 is filled in the through hole 20. As described above, the whole surface copper plating process is performed, so that the Cu plated layer 26 is formed on the seed metal layer 24 in the through hole 20 and the seed metal layer 24 disposed at the bottom portion of the through hole 20. Accordingly, it is possible to prevent the developing solution 34 from reaching the Al layer 16 through the non-sputtered portion 241, thereby preventing the Al layer 16 from corrosion. It should be noted that the Cu plated layer 26 to be filled in the non-sputtered portion 241 preferably has a film thickness between 1.0 and 1.5 μm.

Figure 19:
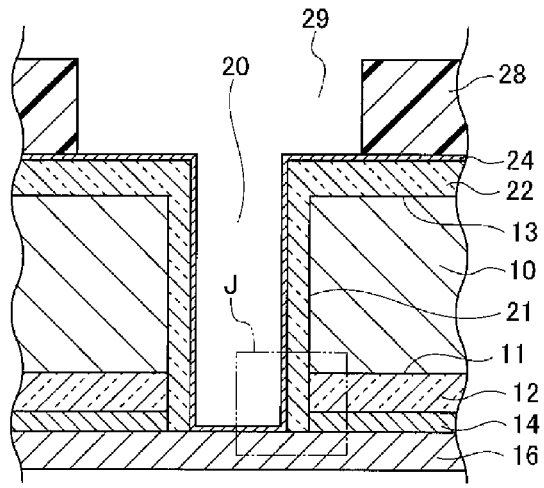
FIG. 19 is a schematic sectional view No. 1 showing a conventional method of producing a conventional semiconductor device.
Figure 20:
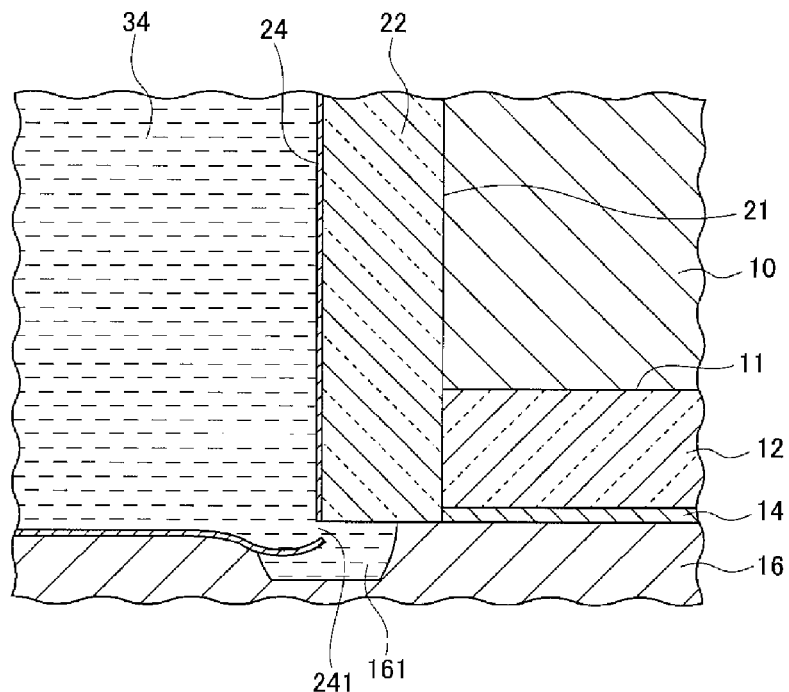
FIG. 20 is a schematic enlarged partial sectional view of an area J in FIG. 19.
Figure 21:
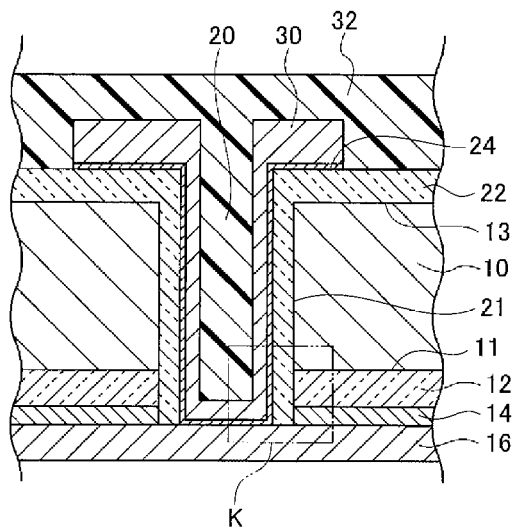
FIG. 21 is a schematic sectional view No. 2 showing the conventional method of producing the conventional semiconductor device.

As a comparison to the first embodiment of the present invention, a conventional method of producing a conventional semiconductor device will be explained next. FIG. 19 is a schematic sectional view No. 1 showing the conventional method of producing the conventional semiconductor device. FIG. 20 is a schematic enlarged partial sectional view of an area J in FIG. 19. FIG. 21 is a schematic sectional view No. 2 showing the conventional method of producing the conventional semiconductor device. FIG. 20 is a schematic enlarged partial sectional view of an area K in FIG. 21.

In the conventional method of producing the conventional semiconductor device, as shown in FIG. 19, the whole surface copper plating process is not performed, so that the Cu plated layer 26 is not formed on the seed metal layer 24 in the through hole 20 and the seed metal layer 24 disposed at the bottom portion of the through hole 20. In the next step, as shown in FIG. 20, when the dry film 28 is formed, the developing solution 34 (for example, sodium carbonate solution) of the dry film 28 is filled in the through hole 20. As a result, the developing solution 34 of the dry film 28 reaches the Al layer 16 through the non-sputtered portion 241, thereby causing corrosion of the Al layer 16 and creating an aluminum (Al) void portion 161.

In the conventional method of producing the conventional semiconductor device, in the next step as shown in FIG. 21, the Cu plated layer 30 is formed on the seed metal layer 24 with the dry film 28 as the mask. Afterward, the solder resist 32 is formed on the CVD oxide layer 22 on the main surface 13 of the semiconductor silicon substrate 10, the Cu plated layer 30 on the main surface 13, and in the opening portion 31 of the Cu plated layer 30 in the through hole 20.

Figure 22:
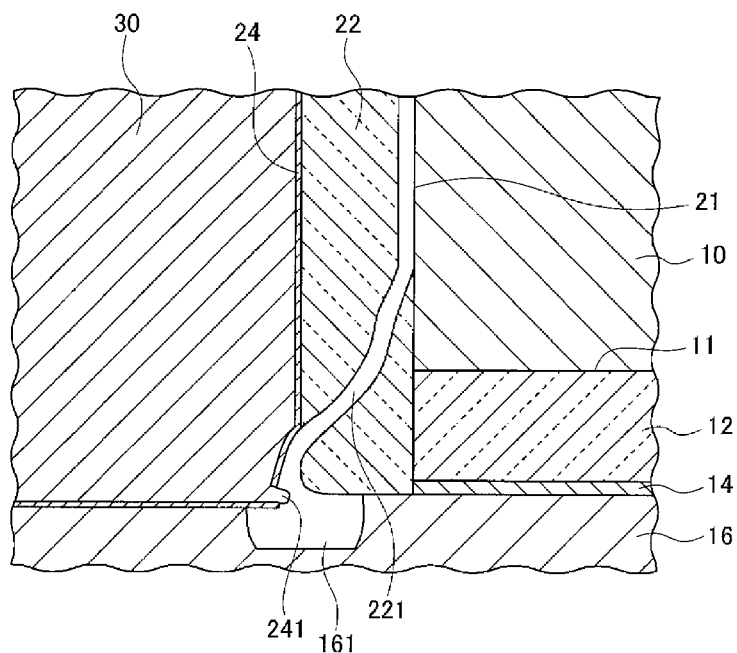
FIG. 22 is a schematic enlarged partial sectional view of an area K in FIG. 21.

In the later step, a solder ball may be formed through a reflow process, or the conventional semiconductor device may be mounted on an electric device. When the conventional semiconductor device is subject to heat in the reflow process of the solder ball or the mounting process thereof, or to an external stress, a thermal stress and the like, a crack 221 may be created in the CVD oxide layer 22 with the aluminum (Al) void portion 161 as a starting point as shown in FIG. 22. When the crack 221 is created in the CVD oxide layer 22, a malfunction due to leak tends to easily occur, thereby lowering reliability of the conventional semiconductor device.

Second Embodiment

Figure 13A:
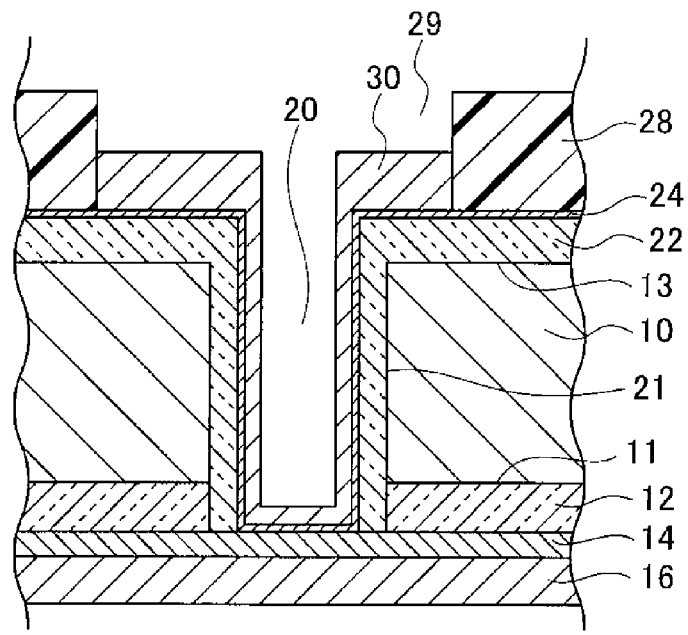
FIG. 13(A) is a schematic sectional view No. 4 showing the method of producing the semiconductor device according to the second embodiment of the present invention.
Figure 13B:
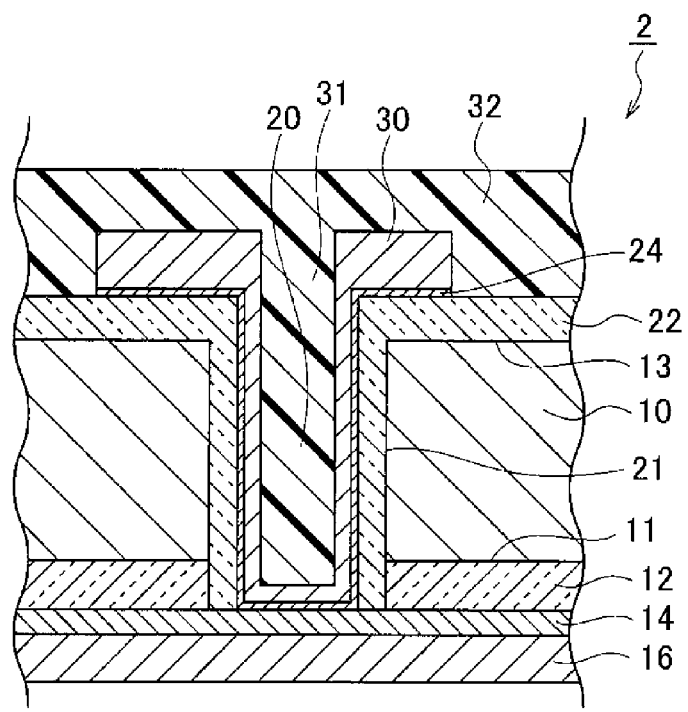
FIG. 13(B) is a schematic sectional view showing the semiconductor device according to the second embodiment of the present invention.

A second embodiment of the present invention will be explained. FIG. 13(B) is a schematic sectional view showing a semiconductor device 2 according to the second embodiment of the present invention.

As shown in FIG. 13(B), the semiconductor device 2 includes a semiconductor silicon substrate 10; a silicon oxide layer 12; a titanium nitride (TiN) layer 14; an aluminum (Al) layer 16; a through hole 20; a CVD (Chemical Vapor Deposition) oxide layer 22; a seed metal layer 24; a copper (Cu) plated layer 30; and a solder resist 32.

As described above, in the first embodiment, the whole surface copper plating process is performed, so that the Cu plated layer 26 is formed on the seed metal layer 24 in the through hole 20 and the seed metal layer 24 disposed at the bottom portion of the through hole 20. As a result, the non-sputtered portion 241 is covered with the Cu plated layer 26. Accordingly, it is possible to prevent the developing solution 34 from reaching the Al layer 16 through the non-sputtered portion 241, thereby preventing the Al layer 16 from corrosion. In contrast, in the second embodiment, the whole surface copper plating process is not performed, so that the Cu plated layer 26 is not formed on the seed metal layer 24.

Further, as described above, in the first embodiment, the silicon oxide layer 12 and the TiN layer 14 are etched, so that the Al layer 16 is exposed at the bottom portion of the through hole 20 (refer to FIG. 1(C)). In contrast, in the second embodiment, only the silicon oxide layer 12 is removed, and the TiN layer 14 is not removed through the etching process.

In the second embodiment, the through hole 20 is formed to penetrate through the semiconductor silicon substrate 10 from the main surface 11 to the main surface 13 of the semiconductor silicon substrate 10 opposite to the main surface 11 of the semiconductor silicon substrate 10. Further, the through hole 20 is formed to penetrate through the silicon oxide layer 12, so that the TiN layer 14 is exposed at the bottom portion of the through hole 20.

In the second embodiment, the CVD oxide layer 22 is disposed on the side surface 21 of the through hole 20 and the main surface 13 of the semiconductor silicon substrate 10. The seed metal layer 24 is disposed on the CVD oxide layer 22 in the through hole 20 and the CVD oxide layer 22 on the main surface 13 as well as on the TiN layer 14 exposed at the bottom portion of the through hole 20. The Cu plated layer 30 is disposed on the seed metal layer 24 in the through hole 20 and the seed metal layer 24 on the main surface 13 as well as on the seed metal layer 24 disposed at the bottom portion of the through hole 20.

In the second embodiment, the solder resist 32 is disposed on the CVD oxide layer 22 on the main surface 13 of the semiconductor silicon substrate 10 and the Cu plated layer 30 on the main surface 13 as well as in the opening portion 31 of the Cu plated layer 30 in the through hole 20. The silicon oxide layer 12 is disposed on the main surface 11 of the semiconductor silicon substrate 10; the TiN layer 14 is disposed on the silicon oxide layer 12; and the Al layer 16 is disposed on the TiN layer 14. It should be noted that a circuitry element (not shown) such as a semiconductor element including a MOS transistor is formed on the main surface 11 of the semiconductor silicon substrate 10, and is covered with the silicon oxide layer 12.

Figure 10A:
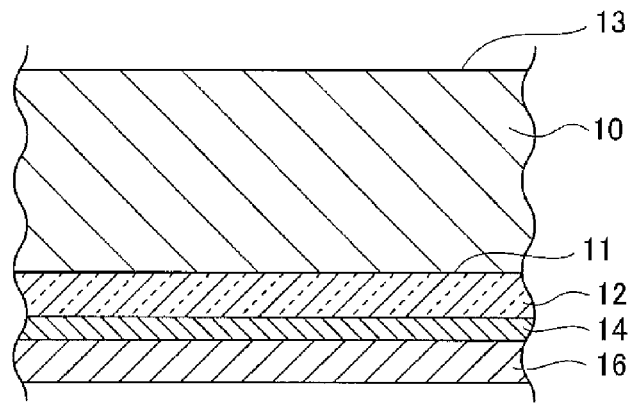
FIGS. 10(A) to 10(C) are schematic sectional views No. 1 showing a method of producing a semiconductor device according to a second embodiment of the present invention.
Figure 10B:
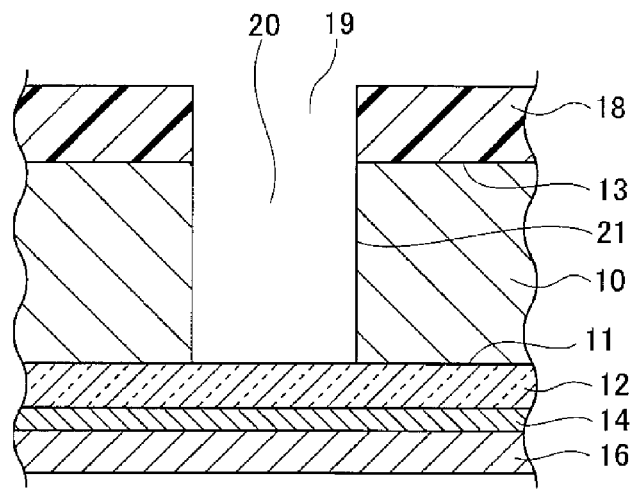
Figure 10C:
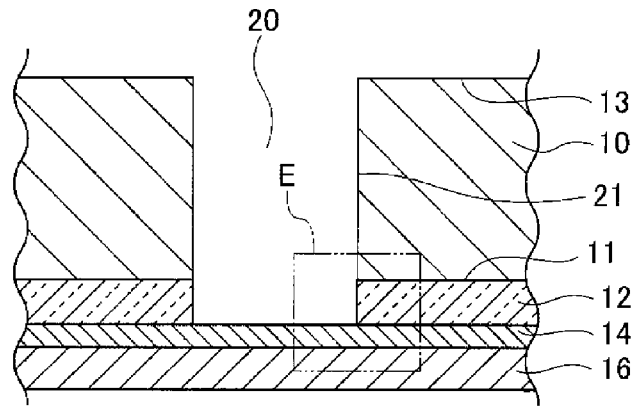
Figure 11A:
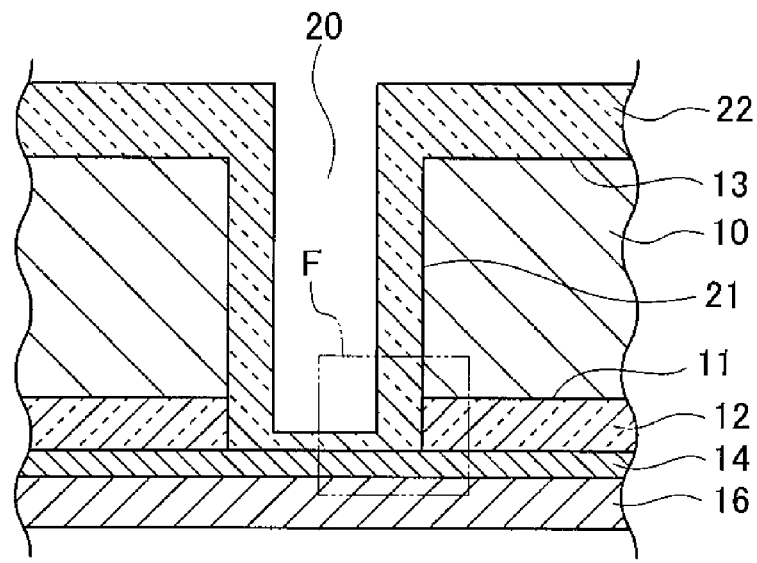
FIGS. 11(A) and 11(B) are schematic sectional views No. 2 showing the method of producing the semiconductor device according to the second embodiment of the present invention.
Figure 11B:
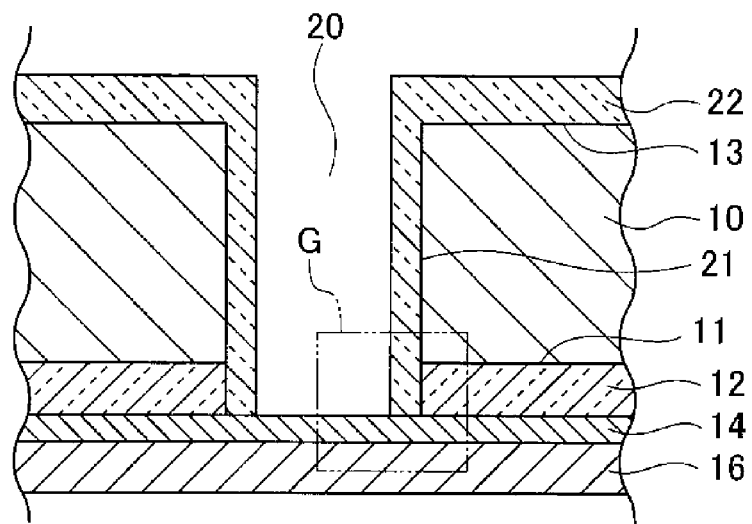

A method of producing the semiconductor device 2 will be explained next with reference to FIGS. 10(A)-10(C) to FIG. 18. FIGS. 10(A) to 10(C) are schematic sectional views No. 1 showing a method of producing the semiconductor device 2 according to the second embodiment of the present invention. FIGS. 11(A) and 11(B) are schematic sectional views No. 2 showing the method of producing the semiconductor device 2 according to the second embodiment of the present invention.

Figure 12A:
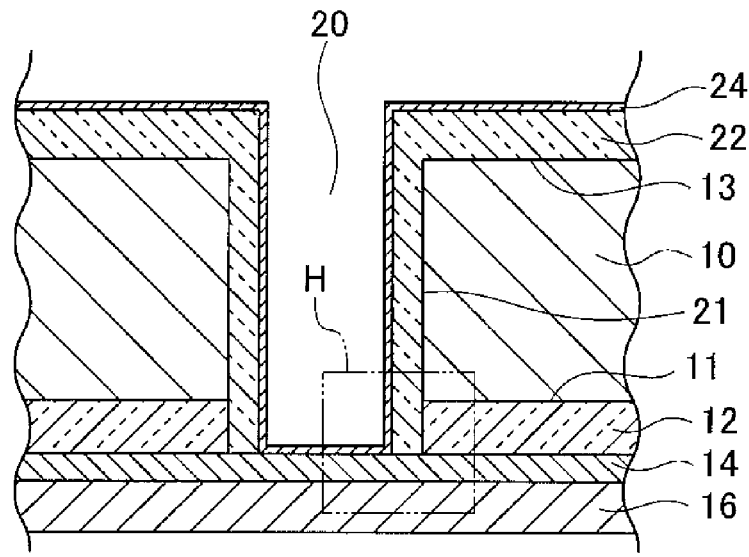
FIGS. 12(A) and 12(B) are schematic sectional views No. 3 showing the method of producing the semiconductor device according to the second embodiment of the present invention.
Figure 12B:
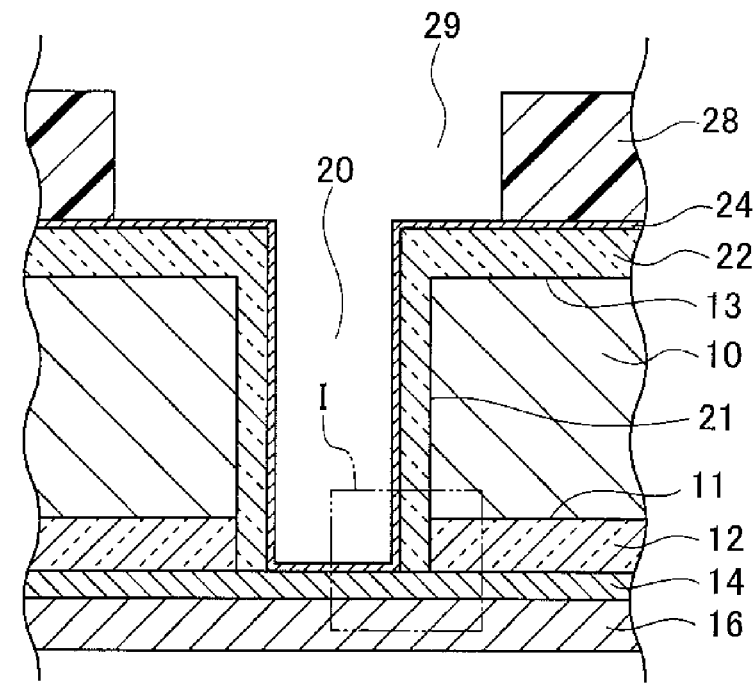

Further, FIGS. 12(A) and 12(B) are schematic sectional views No. 3 showing the method of producing the semiconductor device 2 according to the second embodiment of the present invention. FIG. 13(A) is a schematic sectional view No. 4 showing the method of producing the semiconductor device 2 according to the second embodiment of the present invention.

First, a circuitry element (not shown) such as a semiconductor element like a MOS transistor and the like is formed on the main surface 11 of the semiconductor silicon substrate 10.

As shown in FIG. 10(A), in the next step, the silicon oxide layer 12 is formed on the main surface 11 of the semiconductor silicon substrate 10, and the TiN layer 14 is formed on the silicon oxide layer 12. Further, the Al layer 16 is formed on the TiN layer 14. It should be noted that the TiN layer 14 is provided for preventing migration of aluminum (Al).

As shown in FIG. 10(B), in the next step, the resist 18 is formed on the main surface 13 of the semiconductor silicon substrate 10 opposite to the main surface 11, and the opening portion 19 is selectively formed in the resist 18. Afterward, the etching process is performed on the semiconductor silicon substrate 10 with the resist 18 as a mask, so that the through hole 20 is formed to penetrate through the semiconductor silicon substrate 10 from the main surface 13 to the main surface 11 of the semiconductor silicon substrate 10.

Figure 14:
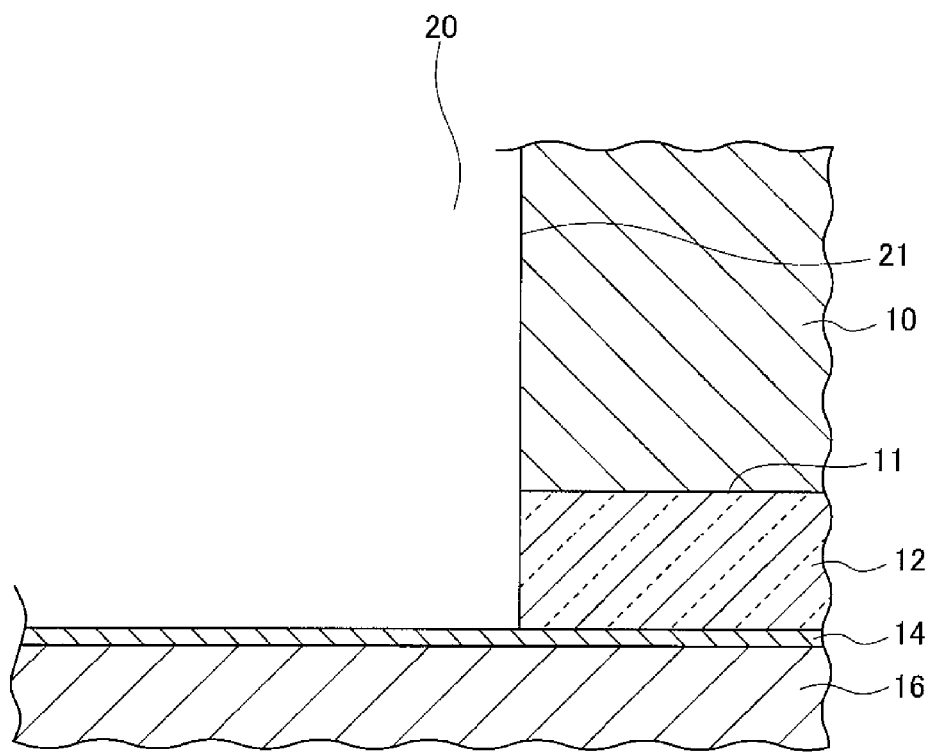
FIG. 14 is a schematic enlarged partial sectional view of an area E in FIG. 10(C) according to the second embodiment of the present invention.

FIG. 14 is a schematic enlarged partial sectional view of an area E in FIG. 10(C) according to the second embodiment of the present invention. As shown in FIG. 10(C) as well as FIG. 14, in the next step, the etching process is further performed on the silicon oxide layer 12, so that the TiN layer 14 is exposed at the bottom portion of the through hole 20.

Figure 15:
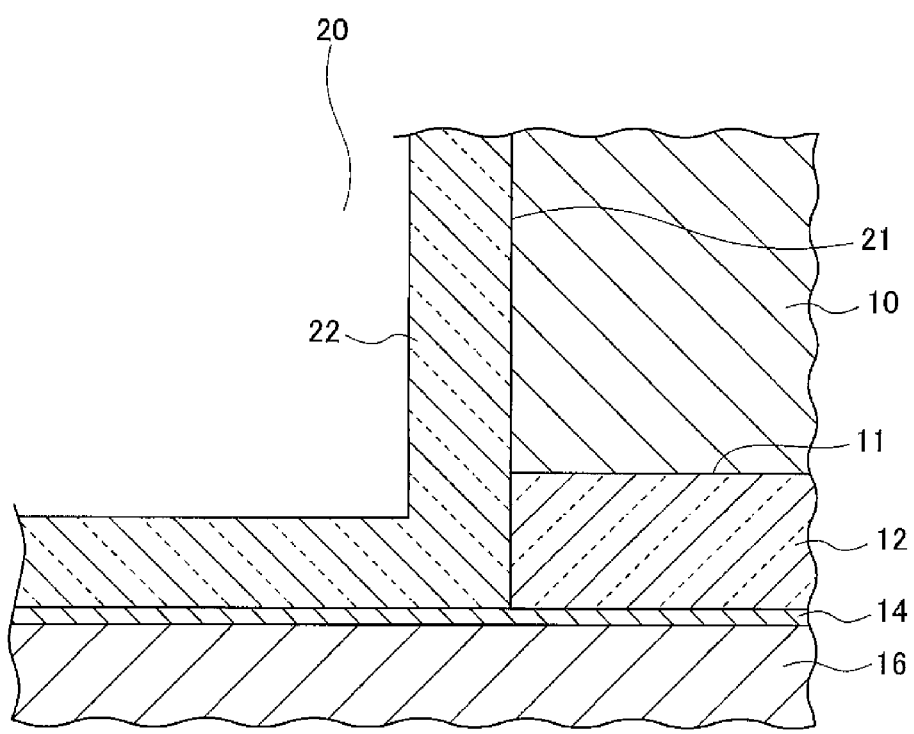
FIG. 15 is a schematic enlarged partial sectional view of an area F in FIG. 11(A) according to the second embodiment of the present invention.

FIG. 15 is a schematic enlarged partial sectional view of an area F in FIG. 11(A) according to the second embodiment of the present invention. As shown in FIG. 11(A) as well as FIG. 15, in the next step, the CVD oxide layer 22 is formed on the side surface 21 and the bottom portion of the through hole 20 and the main surface 13 of the semiconductor silicon substrate 10.

Figure 16:
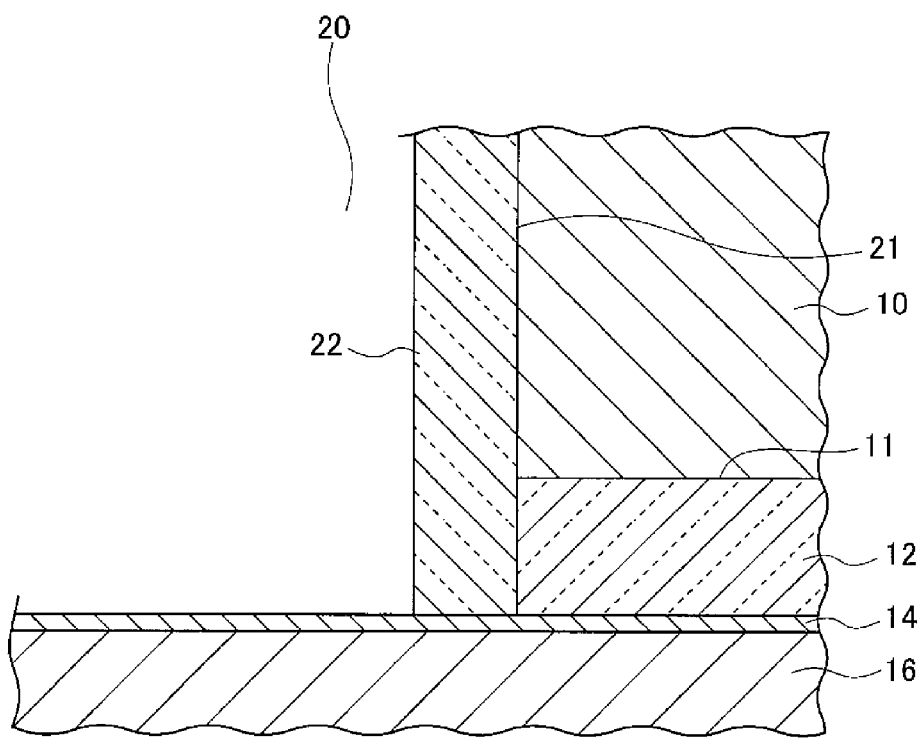
FIG. 16 is a schematic enlarged partial sectional view of an area G in FIG. 11(B) according to the second embodiment of the present invention.

FIG. 16 is a schematic enlarged partial sectional view of an area G in FIG. 11(B) according to the second embodiment of the present invention. As shown in FIG. 11(B) as well as FIG. 16, in the next step, the etching process is performed on the CVD oxide layer 22, so that the TiN layer 14 is exposed at the bottom portion of the through hole 20.

Figure 17:
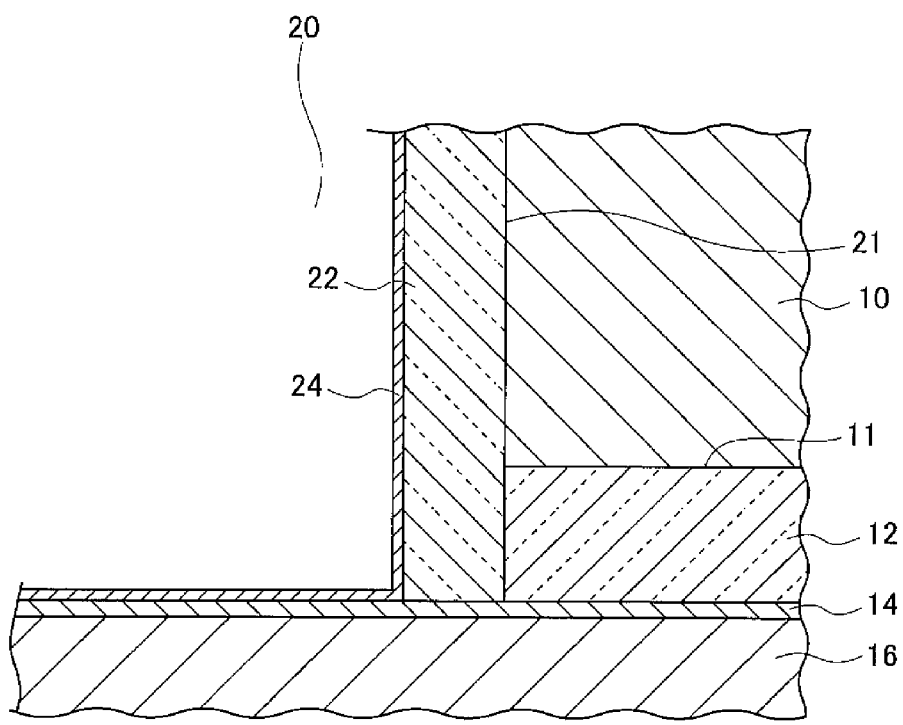
FIG. 17 is a schematic enlarged partial sectional view of an area H in FIG. 12(A) according to the second embodiment of the present invention.

FIG. 17 is a schematic enlarged partial sectional view of an area H in FIG. 12(A) according to the second embodiment of the present invention. As shown in FIG. 12(A) as well as FIG. 17, in the next step, the sputtering process is performed, so that the seed metal layer 24 is formed on the CVD oxide layer 22 in the through hole 20, the CVD oxide layer 22 on the main surface 13, and the TiN layer 14 exposed at the bottom portion of the through hole 20. When the seed metal layer 24 is formed, titanium (Ti) is sputtered first, and then copper (Cu) is sputtered afterward.

Figure 18:
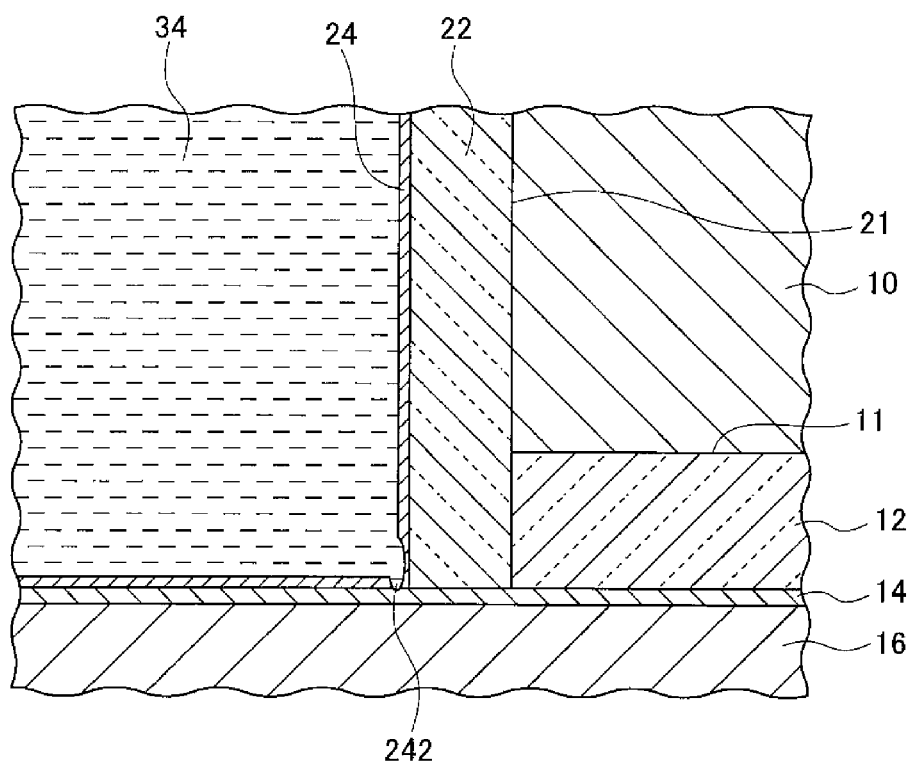
FIG. 18 is a schematic enlarged partial sectional view of an area I in FIG. 12(B) according to the second embodiment of the present invention.

FIG. 18 is a schematic enlarged partial sectional view of an area I in FIG. 12(B) according to the second embodiment of the present invention. As shown in FIG. 12(B) as well as FIG. 18, in the next step, the dry film 28 is formed on the seed metal layer 24 on the CVD oxide layer 22, and the opening portion 29 is selectively formed in the dry film 28, so that the through hole 20 and the seed metal layer 24 around the through hole 20 are exposed in the opening portion 29.

As shown in FIG. 13(A), in the next step, with the dry film 28 as a mask, the Cu plated layer 30 is formed on the seed metal layer 24 in the through hole 20, the seed metal layer 24 on the main surface 13 in the opening portion 29 of the dry film 28, and the seed metal layer 24 disposed at the bottom portion of the through hole 20. When the Cu plated layer 30 is formed, the electrolytic plating process using the seed metal layer 24 is performed.

As shown in FIG. 13(B), in the next step, the dry film 28 is removed. Afterward, the seed metal layer 24 not covered with the Cu plated layer 30 is removed. Then, the solder resist 32 is formed on the CVD oxide layer 22 on the main surface 13 of the semiconductor silicon substrate 10, the Cu plated layer 30 on the main surface 13, and in the opening portion 31 of the Cu plated layer 30 in the through hole 20.

As described above, in general, it is difficult to form the seed metal layer 24 uniformly in the through hole 20 through the sputtering process. As shown in FIG. 18, a non-sputtered portion 242 may be generated at a corner of the bottom portion of the through hole 20.

In the second embodiment, as described above, the TiN layer 14 is not removed and remains, so that the TiN layer 14 functions as a barrier. Accordingly, even when the non-sputtered portion 242 is generated, it is possible to prevent the developing solution 34 (for example, sodium carbonate solution) of the dry film 28 from reaching the Al layer 16 through the non-sputtered portion 242, thereby preventing the Al layer 16 from corrosion.

As described above, in the second embodiment, although the TiN layer 14 is not removed and remains, the silicon oxide layer 12 is etched such that the TiN layer 14 is exposed at the bottom portion of the through hole 20. When the silicon oxide layer 12 is etched, depending on a variance in an etching characteristic in a plane, the TiN layer 14 may be partially removed. When the TiN layer 14 is partially removed, the developing solution 34 (for example, sodium carbonate solution) of the dry film 28 may reach the Al layer 16 through the non-sputtered portion 242 and the partially removed portion of the TiN layer 14, thereby causing corrosion of the Al layer 16. In this case, as described in the first embodiment, it may be preferred that the whole surface copper plating process is performed, so that the Cu plated layer 26 is formed on the seed metal layer 24 in the through hole 20 and the seed metal layer 24 disposed at the bottom portion of the through hole 20.

As described above, the first and second embodiments of the present invention are explained. It should be noted that the present invention is not limited to the first and second embodiments. Accordingly, the scope of the invention is limited only by the appended claims.

The disclosure of Japanese Patent Application No. 2012-120284, filed on May 25, 2012, is incorporated in the application by reference.

While the invention has been explained with reference to the specific embodiments of the invention, the explanation is illustrative and the invention is limited only by the appended claims.

What is claimed is:

1. A method of producing a semiconductor device comprising the steps of:
preparing a semiconductor substrate having a first main surface and a second main surface opposite to the first main surface, said semiconductor substrate including a first conductive layer formed on the second main surface;
forming a through hole in the semiconductor substrate so that the through hole penetrates through the semiconductor substrate from the first main surface to the second main surface, said first conductive layer being exposed at a bottom portion of the through hole;
forming a seed layer in the through hole and on the first main surface so that the seed layer is disposed on a side surface of the through hole from the bottom portion of the through hole to the first main surface;
forming a second conductive layer in the through hole so that the second conductive layer is disposed on the seed layer formed in the through hole and on the first main surface through a first plating process;
forming a resist on the second conductive layer;
performing a developing process to form an opening portion in the resist so that the second conductive layer in the through hole and on the first main surface is continuously exposed in the opening portion; and
forming a third conductive layer on the second conductive layer formed in the through hole and on the first main surface according to the resist with the opening portion formed therein.

2. The method of producing the semiconductor device according to claim 1, wherein, in the step of forming the seed layer on the side surface of the through hole, said seed layer is formed through a sputtering process.

3. The method of producing the semiconductor device according to claim 1, further comprising the steps of removing the resist; and
removing the second conductive layer and the seed layer exposed from the third conductive layer.

4. The method of producing the semiconductor device according to claim 3, further comprising the step of forming a protective layer on the first main surface after the second conductive layer and the seed layer are removed.

5. The Method of producing the semiconductor device according to claim 1, in the step of forming the second conductive layer on the seed layer, said first plating process is a non-electrolytic plating process or an electrolytic plating process.

6. The method of producing the semiconductor device according to claim 1, in the step of performing the second plating process to from the third conductive layer on the second conductive layer, said second plating process is an electrolytic plating process.

7. The method of producing the semiconductor device according to claim 1, in the step of forming the second conductive layer on the seed layer, said first plating process is performed so that the second conductive layer covers a defect of the seed layer.

8. A method of producing a semiconductor device, comprising the steps of:
preparing a semiconductor substrate having a first main surface and a second main surface opposite to the first main surface, said semiconductor substrate including a first conductive layer formed on the second main surface and a second conductive layer formed on the first conductive layer;
forming a through hole in the semiconductor substrate so that the through hole penetrates through the semiconductor substrate from the first main surface to the second main surface, said first conductive layer being exposed at a bottom portion of the through hole;

forming a seed layer on a side surface of the through hole from the bottom portion of the through hole to the first main surface;

forming a resist layer on the seed layer;

forming an opening portion in the resist layer through a developing process so that the through hole is exposed; and forming a third conductive layer on the seed layer exposed from the resist layer through a first plating process with the resist layer having the opening portion arranged as a mask.

* * * * *